(12) United States Patent
Whatmough et al.

(10) Patent No.: US 9,548,749 B2
(45) Date of Patent: Jan. 17, 2017

(54) OPERATING PARAMETER CIRCUITRY AND METHOD

(71) Applicant: ARM Limited, Cambridge (GB)

(72) Inventors: Paul Nicholas Whatmough, Cambridge (GB); David Michael Bull, Cambridge (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/531,479

(22) Filed: Nov. 3, 2014

(65) Prior Publication Data

US 2016/0126960 A1    May 5, 2016

(51) Int. Cl.
| H03L 7/06 | (2006.01) |
| H03L 7/10 | (2006.01) |
| H03L 7/099 | (2006.01) |

(52) U.S. Cl.
CPC ............. *H03L 7/102* (2013.01); *H03L 7/0992* (2013.01); *H03L 2207/06* (2013.01)

(58) Field of Classification Search
CPC ....................................................... H03L 7/08
See application file for complete search history.

(56) References Cited

U.S. PATENT DOCUMENTS

2012/0294095 A1* 11/2012 Shiu ..................... G11C 7/1057
                                                                365/189.11
2015/0188553 A1*  7/2015 Familia ................... H03L 7/097
                                                                327/5

OTHER PUBLICATIONS

Hart, Jason M. et al., "A 3.6 GHz 16-Core SPARC SoC Processor in 28 nm", IEEE Journal of Solid-State Circuits, vol. 49, No. 1, (Jan. 2014), pp. 19-31.
Kurd, Nasser et al., "Next Generation Intel® Core™ Micro-Architecture (Nehalem) Clocking", IEEE Journal of Solid-State Circuits, vol. 44 No. 4, (Apr. 2009), pp. 1121-1129.
Kim, Bongjin et al., "A 32nm, 0.9V Supply-Noise Sensitivity Tracking PLL for Improved Clock Data Compensation Featuring a Deep Trench Capacitor Based Loop Filter", 2013 Symposium on VLSI Circuits Digest of Technical Papers, (2013), pp. C162-C163.

(Continued)

*Primary Examiner* — Daniel Puentes
(74) *Attorney, Agent, or Firm* — Pramudji Law Group PLLC; Ari Pramudji

(57) ABSTRACT

An operating parameter method and circuitry are provided that generate operating parameter signals that are compensated for noise. Such operating parameter circuitry includes control loop circuitry that operates from a first power supply to provide an operating parameter signal to functional circuitry operating from a second power supply separate from the first power supply. The control loop circuitry comprises generator circuitry to generate the operating parameter signal based on an input signal. Replica generator circuitry operates from the second power supply to generate a further operating parameter signal based on the input signal. Adjustment circuitry performs a comparison on the operating parameter signal and the further operating parameter signal and causes an adjusted input signal to be produced in dependence on a result of the comparison. The adjusted input signal is received by the generator circuitry. Consequently, the generator circuitry is able to produce an operating parameter signal that has been compensated for noise in the circuit.

16 Claims, 7 Drawing Sheets

(56) References Cited

OTHER PUBLICATIONS

Kim, Bongjin et al., "A Supply-Noise Sensitivity Tracking PLL in 32 nm SOI Featuring a Deep Trench Capacitor Based Loop Filter", IEEE Journal of Solid-State Circuits, vol. 49, No. 4, (Apr. 2014), pp. 1017-1026.

Bowman, Keith A. et al., "A 22 nm All-Digital Dynamically Adaptive Clock Distribution for Supply Voltage Droop Tolerance", IEEE Journal of Solid-State Circuits, vol. 48, No. 4, (Apr. 2013), pp. 907-916.

* cited by examiner

OPERATING PARAMETER CIRCUITRY AND METHOD

TECHNICAL FIELD

The present disclosure relates to the field of methods and circuitry for operating parameters.

DESCRIPTION OF THE PRIOR ART

In a data processing apparatus, one or more components may be regulated by use of a clock signal. Those components may operate in response to, for example, a rising edge of the clock signal. By clocking components in this manner, it is possible to provide a regulated period of time in which signals can move around. This helps to ensure that operations performed by circuitry are performed in "lockstep", i.e. as a component outputs a data signal, another input signal will arrive at that component to be processed at the next rising clock edge. Keeping components in lockstep can help to prevent data signals from interfering with each other.

Problems arise, however, when noise occurs. For example, when components in the functional circuitry operate, they draw current. This causes the supply voltage to vary. In other words, the operation of some components may cause the voltage supplied to other components in the functional circuitry to vary. This can affect other operating parameters in the circuit. For example, oscillators used to generate clock signals are often dependent on a voltage supply. However, if the voltage supply varies then the period and pulse width of the clock signal output by the oscillator will also change. Similarly, the clock signal is distributed through a clock path or clock tree to the functional circuitry. However, due to the variance in supply voltage, the clock signal may become distorted while being disseminated through the clock path. When either of these things happens, the above mentioned interference of data signals may occur. This happens because data signals may no longer be provided at the correct time. For example, if the clock signal is too fast (due to noise) then a component may not have completed outputting a signal before the next clock pulse occurs. This may result in components operating on the wrong data signals or multiple signals interfering with each other.

A number of approaches to handling the noise have been previously proposed. Some such proposals involve adjusting the clock signal or the supply voltage in order to compensate for the noise. However, these approaches often introduce cycle-to-cycle jitter, which may degrade static timing margins. In particular, if the clock signal, for example, is changed in order to compensate for a sudden change in noise, it is possible that some components will benefit whilst other components will perform more poorly. Furthermore, since a clock signal may take time to disseminate through the clock path, it is possible that a sudden change in noise, if compensated for, will worsen the situation by the time the amended clock signal reaches the components. In contrast, if an adjustment is applied to an operating parameter such as a clock signal for an extended period of time, the efficacy of the circuit may decrease. For example, if the average frequency of a clock signal is decreased then the overall speed of the system will also decrease—thereby resulting in an overall less efficient data processing apparatus.

Accordingly, it would be desirable to be able to compensate for noise experienced when generating operating parameters while reducing the chances of adjustments made to compensate for noise affecting the overall performance of the data processing apparatus.

SUMMARY

According to one aspect there is provided an operating parameter circuitry, comprising: control loop circuitry operating from a first power supply to provide an operating parameter signal to functional circuitry operating from a second power supply separate from the first power supply, the control loop circuitry comprising generator circuitry to generate the operating parameter signal based on an input signal; replica generator circuitry operating from the second power supply to generate a further operating parameter signal based on the input signal; and adjustment circuitry to perform a comparison on the operating parameter signal and the further operating parameter signal and to cause an adjusted input signal to be produced in dependence on a result of the comparison, wherein the adjusted input signal is received by the generator circuitry.

According to a second aspect there is provided a method of generating an operating parameter comprising the steps: supplying power from a first power supply to control loop circuitry; supplying power from a second power supply, separate from the first power supply, to functional circuitry; generating an operating parameter signal based on an input signal using the control loop circuitry; generating a further operating parameter signal based on the input signal using replica generator circuitry operating from the second power supply; performing a comparison on the operating parameter signal and the further operating parameter signal to cause an adjusted input signal to be produced in dependence on a result of the comparison providing the operating parameter signal to the functional circuitry, wherein the adjusted input signal is received by the generator circuitry.

According to a third aspect there is provided an operating parameter circuitry, comprising: control loop means, operating from a first power supply, for providing an operating parameter signal to functional means for performing a function operating from a second power supply separate from the first power supply, the control loop means comprising generator means for generating the operating parameter signal based on an input signal; replica generator means, operating from the second power supply, for generating a further operating parameter signal based on the input signal; and adjustment means for performing a comparison on the operating parameter signal and the further operating parameter signal and for causing an adjusted input signal to be produced in dependence on a result of the comparison, wherein the adjusted input signal is received by the generator means.

BRIEF DESCRIPTION OF THE DRAWINGS

The present technique will be described further, by way of example only, with reference to embodiments thereof as illustrated in the accompanying drawings, in which.

DESCRIPTION OF EXAMPLE EMBODIMENTS

Figure 1:
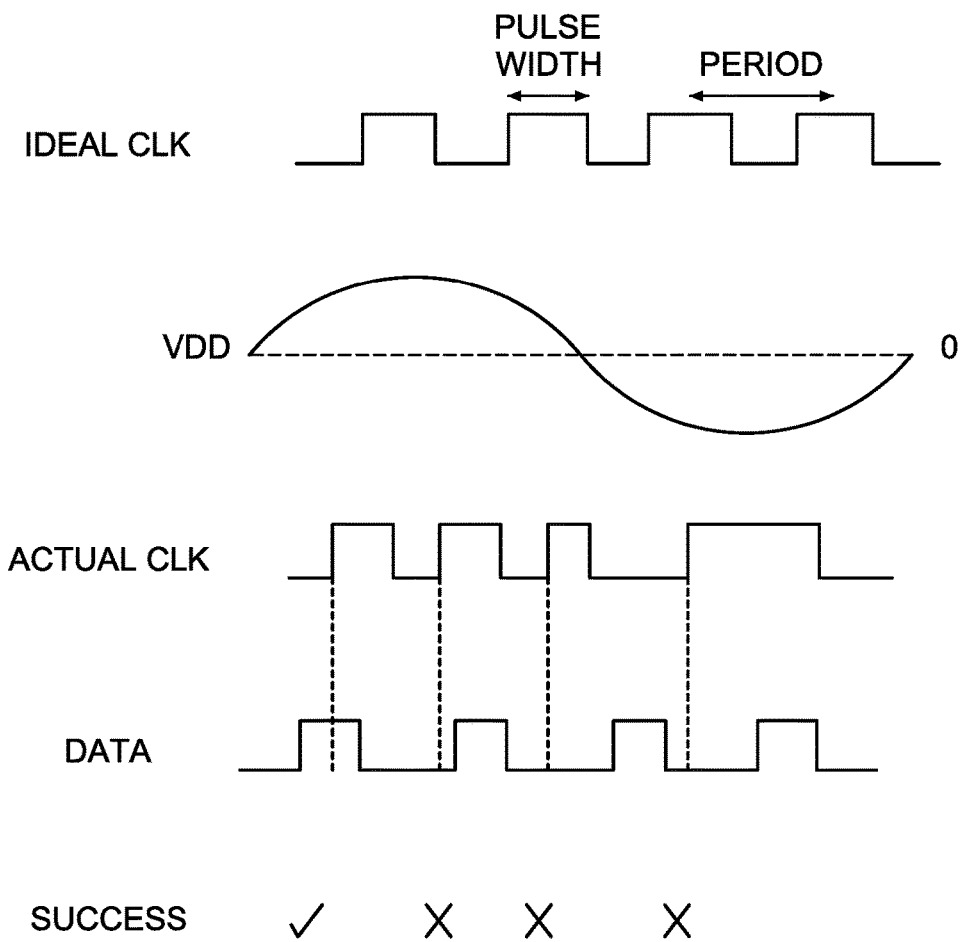
FIG. 1 illustrates a number of signals that may arise in operating parameter circuitry and illustrates how those signals may be affected by noise.

Before discussing the embodiments with reference to the accompanying figures, the following description of embodiments and associated advantages is provided.

In the first aspect, control loop circuitry is provided for generating an operating parameter signal which is provided to functional circuitry. The control loop circuitry comprises generator circuitry. Replica generator circuitry is also provided, which is the same as the generator circuitry and which generates a further operating parameter signal. Whereas the generator circuitry is powered by a first power supply, the replica generator circuitry is powered by a second power supply, which is also used to power the functional circuitry. The first power supply is separate (e.g. different) from the second power supply.

Accordingly, as a result of being powered by the same power supply that powers the functional circuitry, the replica generator circuitry and the further operating parameter signal generated by the replica generator circuitry, may be affected by noise. Conversely, the generator circuitry and the operating parameter signal generated by the generator circuitry may be subject to significantly less noise as a result of being powered by a different (e.g. isolated) power supply. The adjustment circuitry performs a comparison on the operating parameter signal and the further operating parameter signal. Based on the result of this comparison, an adjusted input signal is produced and the adjustment circuitry causes the adjusted input signal to be received by the generator circuitry.

Consequently, the generator circuitry's behaviour is adjusted in dependence on noise, which can be determined by comparing the operating parameter signal (which may be subject to little noise) and the further operating parameter signal (which may be subject to noise experienced by the functional circuitry receiving the operating parameter signal).

In some embodiments, the adjustment circuitry comprises comparison circuitry to perform the comparison to generate a comparison signal, and filter circuitry to generate an adjustment value in dependence on the comparison signal, to apply to the input signal to produce the adjusted input signal. The filter circuitry may perform filtering in order to produce an adjustment value such that the operating parameter circuitry neither causes cycle-to-cycle jitter nor encourages the average value of the operating parameter to decrease.

The comparison circuitry may take a number of different forms. However, in some embodiments, the operating parameter circuitry comprises a phase-frequency detector. In some embodiments, the comparison circuitry comprises a time to digital converter (TDC).

In some embodiments, the filter circuitry may comprise high-pass filter circuitry to at least reduce differences between the operating parameter signal and the further operating parameter signal that are above an upper frequency limit. The term "at least reduce" is intended to cover both the reduction of such changes as well as the elimination of such changes. For example, if the operating parameter is a voltage, and a difference between the voltage produced by the generator circuitry and the voltage produced by the replica generator circuitry has a high frequency spike (e.g. there is a very sudden change in voltage due to noise), then the high-pass filter circuitry may reduce or eliminate that spike in voltage change. Similarly, if the operating parameter is a clock signal, and there is a high frequency change (above an upper limit) between the clock signal produced by the generator circuitry and the clock signal produced by the replica generator circuitry, then the high-pass filter circuitry may reduce or eliminate that change. The upper frequency limit may be set at any value. For example, the upper frequency limit may be set within the range 100 to 200 MHz.

In some embodiments, the filter circuitry may comprise low-pass filter circuitry to at least reduce differences between the operating parameter signal and the further operating parameter signal that are below a lower frequency limit. Here, as above, the term "at least reduce" is intended to include both the reduction of such changes as well as the elimination of such changes. For example, if the operating parameter signal is a clock signal, and there is a low frequency change (below a lower frequency limit) in the difference between the clock signal generated by the generator circuitry and the clock signal generated by the further generator circuitry then that low frequency change may be reduced or eliminated. The lower frequency limit may be set to any value. For example, the lower frequency limit may be set to 1 MHz.

One example of the operating parameter is a clock signal for the functional circuitry, and the control loop may be a phase locked loop. Accordingly, the operating parameter circuitry may be used to help regulate a clock signal, which is subject to deviation by changes in the supply voltage, by the use of the phase locked loop.

In one embodiment, the generator circuitry and the replica generator circuitry may each comprise oscillator circuitry, and the input signal may be generated internally within the phase locked loop. Oscillator circuitry may be used to generate a signal having a particular oscillation profile (i.e. a particular amplitude, frequency, shape, pulse width, etc.) in response to an input signal. One example of such oscillator circuitry is a digitally controlled oscillator (DCO). Such generator circuitry may be used to generate a signal in dependence upon an input word. In this way, a clock signal may be generated in a digital manner. However, in other embodiments, analogue circuitry may be used to generate the operating parameter such as a clock signal. Meanwhile, the input signal may be generated as a result of a feedback process within the phase locked loop. For example, the operating parameter signal generated by the generator circuitry may go through a number of processes in order to produce other signals, which eventually feed back into the generator circuitry. This feedback process may be used to smooth out any adjustments made to the clock signal—for example, as a result of also comparing the output to a reference clock signal generated by a crystal.

The adjustment circuitry may comprise threshold circuitry to place a limit on the adjustment value such that the operating parameter signal generated by the generating circuitry meets a threshold requirement. Such threshold circuitry may be used in order to prevent the operating parameter signal from being adjusted too much or too quickly. For example, if the operating parameter is a clock signal and the supply voltage drops as a result of noise, the adjustment circuitry may increase the clock period in order to compensate. However, there is an upper limit regarding how much the clock period should be increased. If the clock frequency is increased too much, the efficacy of the overall system may deteriorate as a result of the clock period being too small for data signals to be provided in time. This problem can be limited by the use of threshold circuitry that places a limit on the adjustment value such that the operating parameter signal generated by the generating circuitry meets a threshold requirement (which may include an upper limit and/or a lower limit).

The control loop circuitry may comprise loop filter circuitry to generate the input signal in dependence on the operating parameter signal generated by the generator circuitry. Accordingly, the loop filter circuitry that forms part of the control loop may form part of a feedback mechanism. As part of such a feedback mechanism, the loop filter circuitry may reverse the changes made by the adjustment circuitry at each iteration. In other words, the adjustment circuitry may cause an adjusted input signal to be produced and provided to the generator circuitry thereby causing an adjusted operating parameter signal to be generated. This adjusted operating parameter signal may then be fed back as part of the control loop. As part of this control loop, loop filter circuitry may filter out adjusted components of the adjusted operating parameter signal thereby producing a signal that approximately corresponds with the operating parameter signal before it was adjusted by the adjustment circuitry.

In some embodiments, the operating parameter circuitry may comprise monitoring circuitry to perform a predefined action in dependence upon the result of the comparison. In this manner, further actions may be taken depending on the result of the comparison performed by the comparison circuitry. For example, in some embodiments the operating parameter signal is a clock signal and the monitoring circuitry comprises clock gating circuitry. The predefined action may be to halt the clock signal if the result of the comparison exceeds a predefined emergency limit. For example, if the clock signal produced by the replica generator circuitry and the clock signal produced by the generator circuitry differ to a large extent, the clock signal may be halted. This situation may arise if a very large amount of noise exists. Rather than make a large adjustment, it may be more appropriate to simply halt the clock signal until such time as the noise abates.

Particular embodiments will now be described with reference to the figures.

FIG. 1 shows an example embodiment that illustrates the effect of noise on a clock signal. FIG. 1 shows an ideal clock signal. The ideal clock signal has a consistent pulse width and period as shown in FIG. 1. FIG. 1 also illustrates a changing voltage supply (VDD), which may be used to power an oscillator that produces an actual clock signal. In the example of FIG. 1, the voltage supply gradually increases above some base line and then decreases to being below the base line before returning to the base line value. It is known that providing a varying voltage to a clock generator can result in a change in the period of the output clock signal. In particular, by applying a higher voltage to the clock generator, capacitances arising from, for example, transistors may be charged and discharged more quickly, resulting in a faster operation of the circuit and thereby producing a clock signal with a shorter period (higher frequency). As shown in the example of FIG. 1, the varying voltage supply thereby produces an actual clock signal that differs from the ideal clock signal (the ideal clock signal is what would be expected to be produced by the oscillator if the voltage remained at that base line). In particular, the pulse widths and the period of the actual clock signal vary.

As a consequence, data signals may not be ready in time (for example, at a rising clock edge). FIG. 1 shows an example of data signals being asserted and de-asserted. When considering the ideal clock signal, the data values are all asserted at the time of the rising clock edge. However, when considering the actual clock signal, which is subject to noise of the varying voltage supply, the data is not always asserted when the rising clock edges occur (as indicated by the row marked "success"). Accordingly, the data is not always successfully handled.

Figure 2:
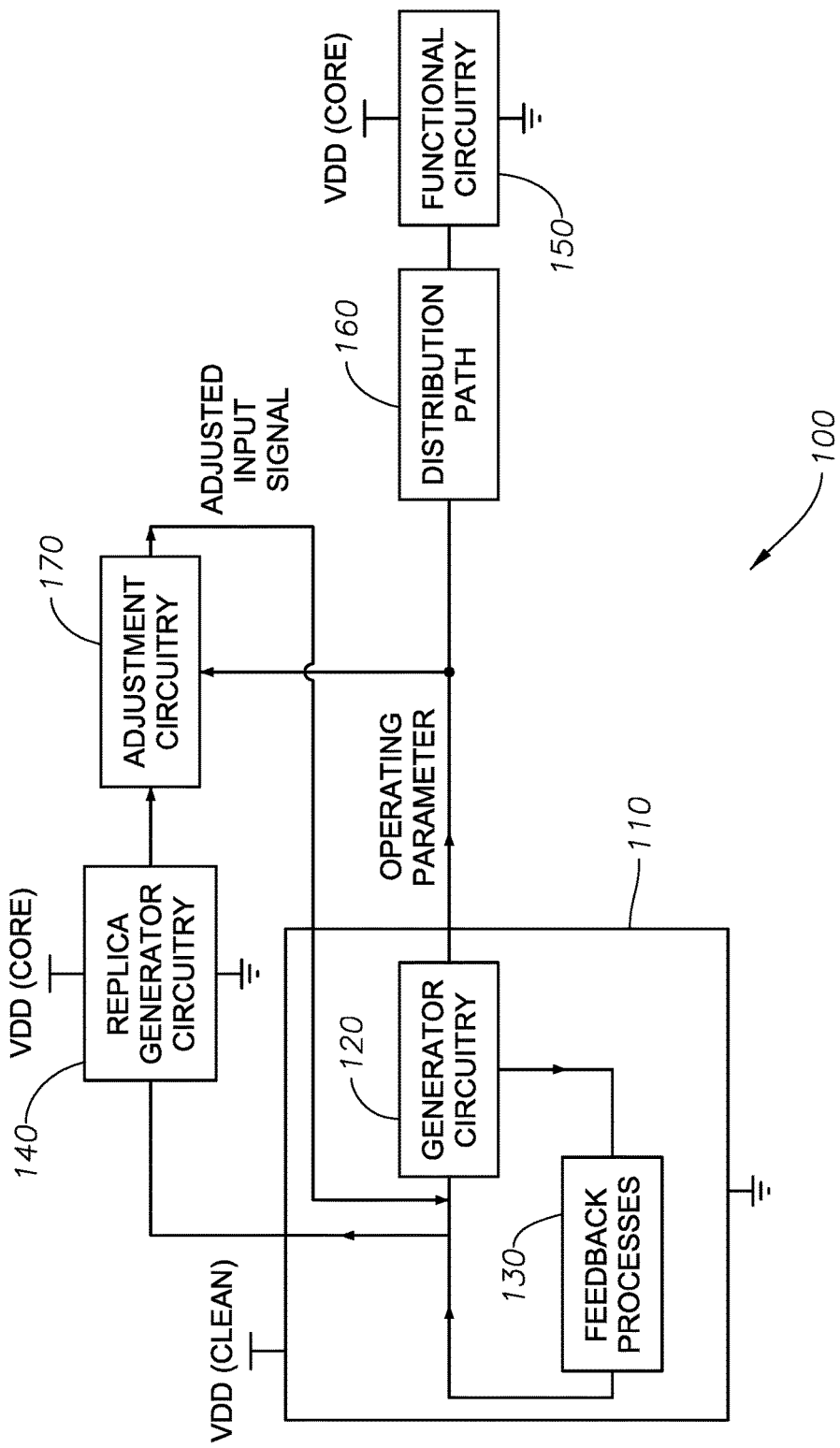
FIG. 2 illustrates operating parameter circuitry in accordance with one embodiment.

FIG. 2 diagrammatically shows circuitry in accordance with one embodiment. In the embodiment shown in FIG. 1, operating parameter circuitry 100 includes control loop circuitry 110 which comprises generator circuitry 120 and feedback processes 130, which collectively form a loop with the output from the generator circuitry 120 being provided to the feedback processes 130, which produce an output that feeds back to the generator circuitry 120.

The control loop circuitry 110 is powered by a first power supply $V_{DD(clean)}$. This differs from the second power supply $V_{DD(core)}$, which is used to power functional circuitry 150, which receives the operating parameter produced by the generator circuitry 120 via a distribution path 160. Replica generator circuitry 140 is also provided, which receives the same output of the feedback processes 130 as received by the generator circuitry 120. The replica generator circuitry is powered by $V_{DD(core)}$, which is also used to power the functional circuitry 150. Since the control loop circuitry 110 uses a different power supply to that of the functional circuitry 150, the operating parameter signal generated by the generator circuitry 120 is not subject to as much noise as the further operating parameter signal generated by the replica generator circuitry 140, which uses the same power supply as that of the functional circuitry 150. Adjustment circuitry 170 is provided and compares both the operating parameter signal produced by the generator circuitry 120 and the further operating parameter circuitry produced by the replica generator circuitry 140. The adjustment circuitry 170 causes an adjusted input signal to be produced in dependence on a result of the comparison. The adjusted input signal is received by the generator circuitry 120 and accordingly the generator circuitry 120 alters the operating parameter signal that it produces. The operating parameter signal produced by the generator circuitry 120 will thereby have been adjusted to compensate for noise that occurs as a result of the second power supply being used by the functional circuitry 150. This signal is then disseminated through the distribution path 160 to the functional circuitry 150. If the operating parameter is a clock signal, then even if fluctuations in the voltage at the functional circuitry 150 or in the distribution path 160 causes the clock signal to be changed, then these changes should cause the clock signal to come into correspondence with an ideal clock signal that would be produced by the generator circuitry 120 in the absence of any noise or adjustment provided by the adjustment circuitry 170.

Figure 3:
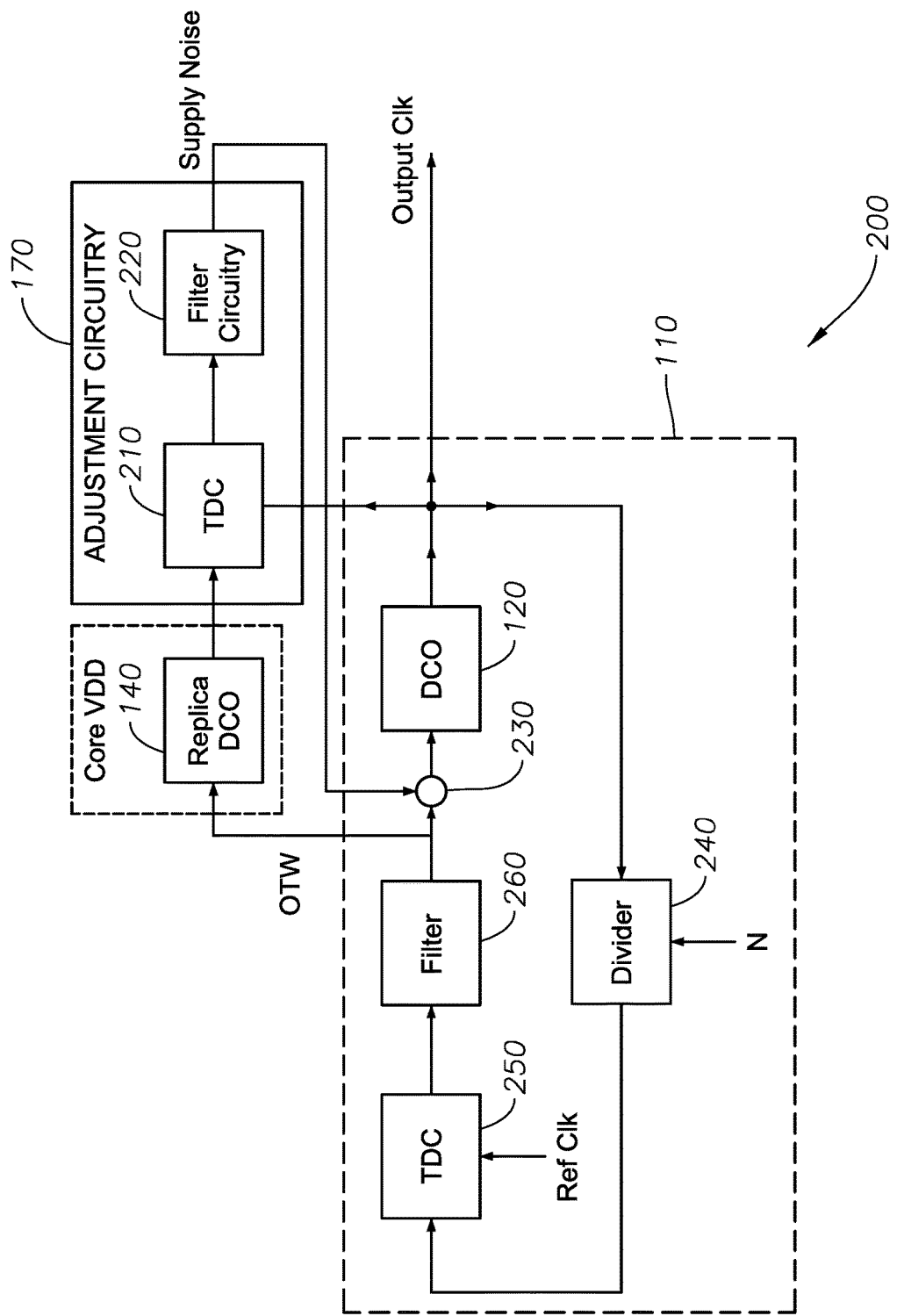
FIG. 3 illustrates operating parameter circuitry in accordance with one embodiment.

FIG. 3 shows operating parameter circuitry 200 in accordance with one embodiment. In the embodiment shown in FIG. 3, the generator circuitry 120 and the replica generator circuitry 140 are each digitally controlled oscillators (DCOs). Each of these generators receives an oscillator tuning word (OTW), which is used to generate the operating parameter signal and the further operating parameter signal, respectively. The adjustment circuitry 170 comprises a time to digital converter (TDC) 210, which receives the operating parameter signal and further operating parameter signal generated by each of the generator circuitry 120 and replica generator circuitry 140 respectively. From these, the TDC 210 (which is an example of comparison circuitry) generates a comparison signal which is sent to filter circuitry 220. In this example, the comparison signal is simply a noise profile—i.e. the result of subtracting the operating parameter signal from the further operating parameter signal.

The filter circuitry 220 performs a number of different operations on the comparison signal to produce an adjustment signal. Addition circuitry 230 produces an adjusted input signal in dependence on the input signal (OTW) and the adjustment signal. This adjusted input signal is only sent to the generator circuitry 120 (not to the replica generator circuitry 140). The generator circuitry 120 then adjusts the operating parameter signal, and this signal is sent as the output clock signal along the distribution path 160 to the functional circuitry 150.

The embodiment of FIG. 3 also illustrates the control loop circuitry 110 and the components that make up the control loop circuitry 110. In particular, together with the generator circuitry 120 and the addition circuitry 230, division circuitry 240 is provided. The division circuitry 240 receives the operating parameter signal generated by the generator circuitry 120. It also receives an input value N. The dividing circuitry 240 divides the operating parameter signal by N in order to produce an output value, which is provided to a control loop TDC 250. The control loop TDC 250 receives a reference clock signal. This may be provided by, for example, a crystal that oscillates at a particular frequency. The control loop TDC 250 is then able to regulate the clock signal in accordance with the reference clock signal which is considered to be accurate. The control loop TDC 250 produces an error value that is fed into the control loop filter 260. Over a period of time, the control loop filter 260 is able to keep track of and adjust for errors in the output clock signal as compared to the reference clock signal 250. During this process, adjustments made as a result of the adjustment circuitry 170 may be filtered out, in order to prevent the control loop filter 260 adjusting for the adjustments made by the adjustment circuitry 170. The control loop filter 260 then produces the oscillator tuning word, which is then fed back into the replica generator circuitry 140 and the generator circuitry 120 as previously described.

As will be appreciated, it is necessary to use the dividing circuitry 240 in order to bring the operating parameter signal value down to a level at which it can be compared to a reference clock. In particular, the operating parameter signal may be produced at a significantly higher frequency than may be provided for a reference clock signal.

Although the embodiment shown in FIG. 3 uses digital components, it will be appreciated that other embodiments may replace some or all of these digital components with analogue components. The use of digital components makes it easier to perform more complicated filtering operations at the filter circuitry 220 and the control loop filter circuitry 260 in a smaller circuit space than could be achieved using analogue components.

Figure 4:
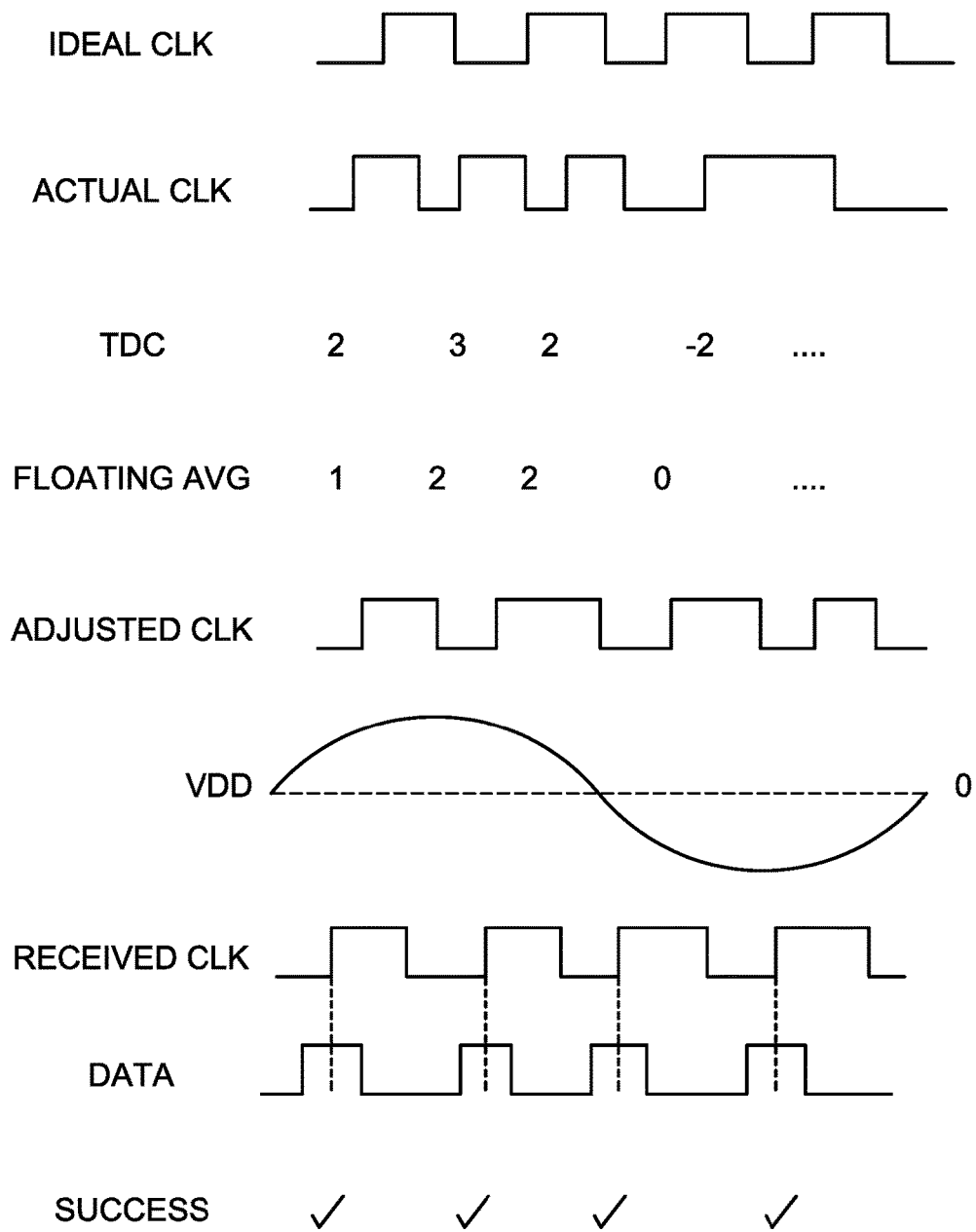
FIG. 4 illustrates a number of signals that may be used in the circuitry of the embodiment shown in FIG. 3 in order to correct for noise.

FIG. 4 shows an example of different signals that may be transmitted within the circuit embodiment shown in FIG. 3.

It is to be noted that the components shown in FIG. 3 may be clocked. Accordingly, each clock period, only a single value may be output by each component.

With this in mind, FIG. 4 again shows an ideal clock signal. This may correspond, for example, with the clock signal produced by the generator circuitry 120 in the absence of any noise filtering or adjustment made by the adjustment circuitry 170. It may also correspond with the signal that would be produced by the reference clock when multiplied by N. As with the example of FIG. 1, the actual clock signal differs from the ideal clock signal as a consequence of noise in the voltage supply. For example, the actual clock signal shown in FIG. 4 may correspond with the clock signal generated by the replica generator circuitry 140, which is powered by a second power supply used to power the functional circuitry 150. The TDC 210 forming part of the adjustment circuitry 170 compares the current value of the clock signal produced by the generator circuitry 120 and the current value of the clock signal produced by the replica generator circuitry 140. Based on these, the TDC 210 produces a value (a comparison signal) representing a current difference between the two clock signals. This value should approximately correspond with the current noise and may be output by the TDC 210. The filter circuitry 220 that forms part of the adjustment circuitry 170 performs filtering on the value generated by the TDC 210 (the comparison signal). This can be used to eliminate particularly high or low changes in the noise of the operating parameter signal. In particular, if the noise were to indicate a sudden (high frequency) change in the operating parameter than this change may be removed or reduced.

One way of achieving such "smoothing" is to use a floating average algorithm. At each iteration, the output of the floating average algorithm is equal to the previous result of applying the floating average algorithm plus the new value, with that total being divided by a constant (e.g. two). Using this algorithm, deviations from the average value are given less weight as time goes on since they are repeatedly divided by the constant.

The filter 220 in the adjustment circuitry 170 then outputs an adjustment signal, which is provided to an addition circuit 230, which also receives the oscillator tuning word generated by the control loop filter 260 in the control loop 110. The combination of these two values results in the adjusted input signal, which is passed to the generator circuitry 120 and output as the operating parameter signal.

An example of the operating parameter signal output by the generator circuitry 120 when it receives the adjusted input signal is shown in FIG. 4 as the adjusted clock signal. This adjusted clock signal has been generated in anticipation of noise being caused by changes in the voltage supply shown as VDD in FIG. 4. As previously described with reference to FIG. 1, the varying value of the voltage supply VDD will cause the clock signal to change. However, in the case of FIG. 4, the clock signal being changed has already been pre-emptively adjusted to compensate for the changes caused by the varying voltage supply. Accordingly, when the voltage supply alters the clock signal, this should result in a received clock signal that closely, but perhaps not identically, corresponds with the ideal clock signal that we started with.

As shown in FIG. 4, the assertion of data corresponds with the rising clock edge of the received clock signal, which is received by the functional clock circuitry 150. Accordingly, the data is correctly handled. However, note that the asserted data does not perfectly correspond with the rising clock edge of the actual clock signal, which would be produced if no adjustments were made by the adjustment circuitry 170. Accordingly, the adjustment circuitry 170 has been able to correct for changes made to the clock signal as a result of the varying voltage supply and has adjusted the clock signal such that it coincides with the assertion of the data values.

Figure 5:
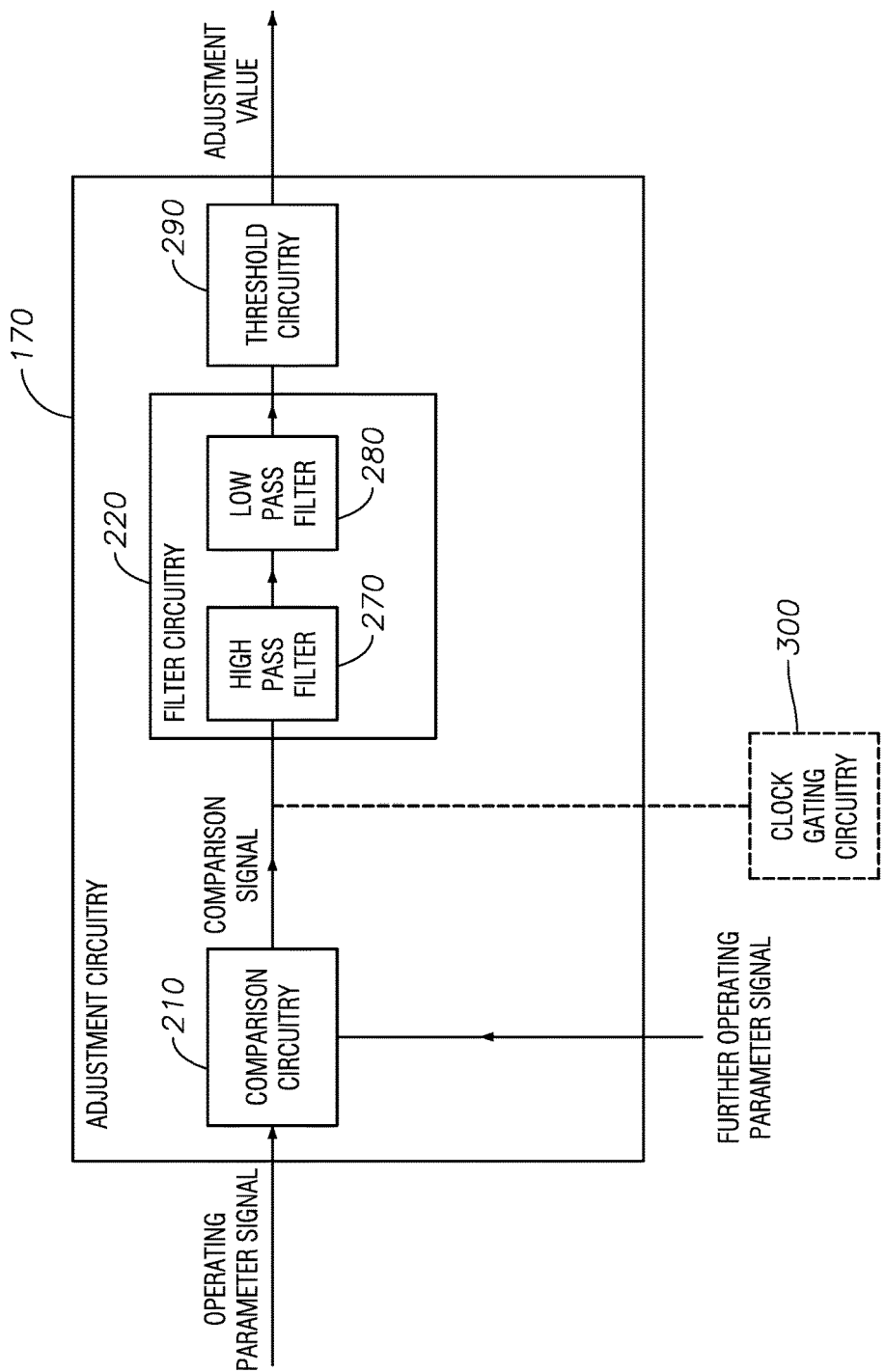
FIG. 5 illustrates adjustment circuitry in accordance with one embodiment.

FIG. 5 shows an example embodiment of the adjustment circuitry 170. In this embodiment, it is shown that the comparison circuitry (for example a TDC) 210 receives both an operating parameter signal (e.g. from generator circuitry 120) and a further operating parameter signal (e.g. from replica generator circuitry 140). In dependence on both signals, a comparison signal is generated which is sent to filter circuitry 170. In this embodiment, the filter circuitry 170 comprises a high-pass filter 270 which is used to reduce or eliminate changes in the difference between the two operating parameter signals that are above a particular frequency. A low-pass filter 280 performs a similar operation, reducing or eliminating changes in the difference that are below a particular frequency. Such filtering may be performed, for example, by using a floating average formula as previously discussed. The resulting filtered comparison signal is then passed to threshold circuitry 290. The threshold circuitry 290 may be used to limit the extent to which any adjustment is made either as a maximum or minimum value. This can be used in order to help prevent the operating parameter signal from exceeding a minimum or maximum threshold beyond which the remainder of the system may be unable to operate properly. Additionally, FIG. 5 shows clock gating circuitry 300 which may also receive the comparison signal when the operating parameter corresponds with a clock signal. The clock gating circuitry 300 may respond to the comparison signal by halting the clock signal altogether. In certain circumstances, for example if the voltage supply varies greatly in a short period of time, it may be desirable to halt the clock entirely rather than attempting to significantly increase or decrease the frequency of the clock signal. Similarly, if the operating parameter signal is a voltage, then similar circuitry may be provided in order to prevent the voltage being dramatically increased or decreased, which may cause circuitry within the system to be damaged as a result.

Figure 6:
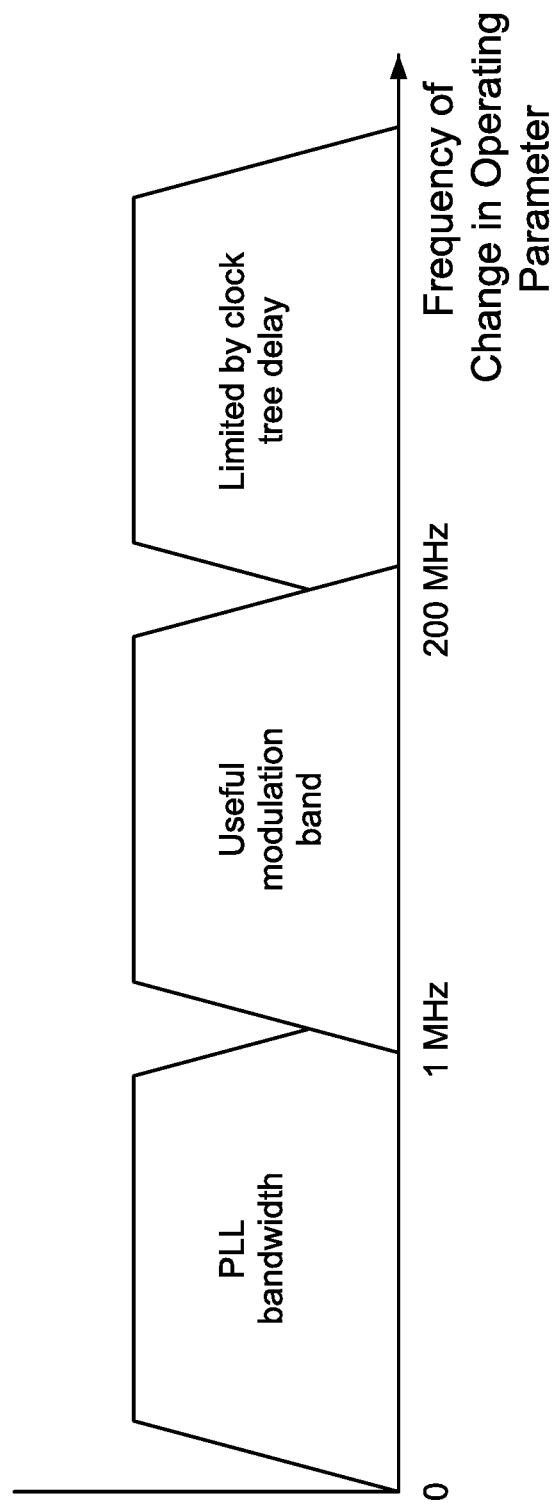
FIG. 6 illustrates a noise spectrum and the effects of correcting for different frequencies of noise.

FIG. 6 illustrates the set of frequencies that may be reduced or eliminated by the high-pass filter 270 and the low-pass filter 280 in the filter circuitry 220. In particular, it may be undesirable to adjust the operating parameter signal in response to low frequency changes in the operating parameter, since this may result in an overall decrease in the average operating parameter. In particular, if the operating parameter is a clock signal, then this would result in the average clock signal being reduced for an extended period of time. Hence, it may be useful to reduce or eliminate changes in the operating parameter that are below 1 MHz. It may also be desirable to reduce or eliminate changes in the operating parameter that are above an upper limit. For example, the upper limit may lie in the range 100 MHz-200 MHz. In these cases, the time that it takes to distribute the adjusted operating parameter signal may be long in comparison to the speed at which the operating parameter signal changes. It may be undesirable to consider such changes, since this may result in continually making adjustments to the operating parameter signal that do not reach the circuitry in time. For example, if the noise changes very suddenly for a short period of time, by the time an adjusted clock signal is distributed through the clock tree, the cause of the noise may disappear. This would then result in an unnecessary change being made to the clock signal.

Figure 7:
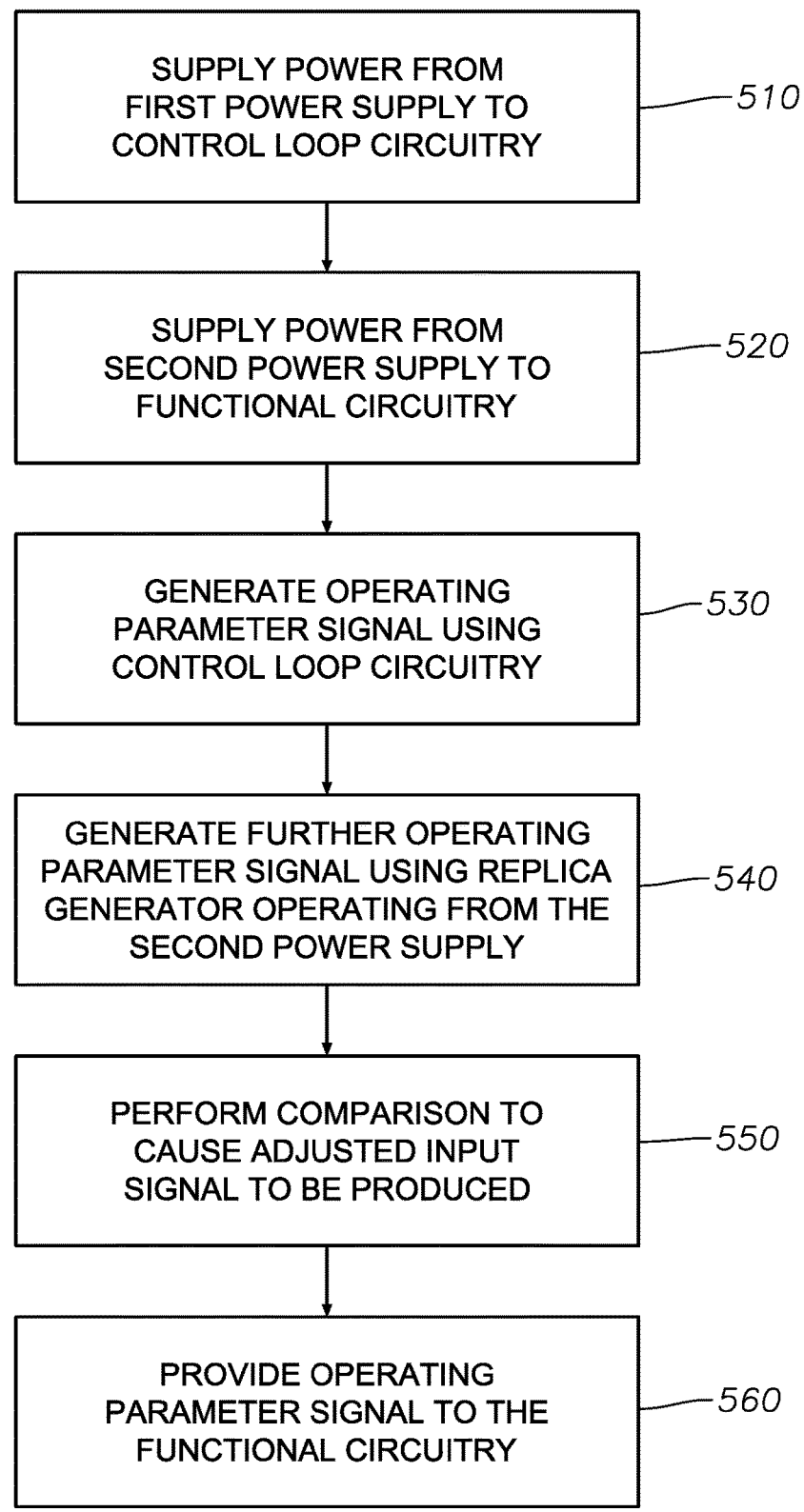
FIG. 7 illustrates, in flow chart form, a method of generating an operating parameter in accordance with one embodiment.

FIG. 7 illustrates, in flow chart form, a method of generating an operating parameter. At step S10, power is supplied from a first power supply to control loop circuitry. At step S20, power is supplied from a second power supply to functional circuitry. At step S30, an operating parameter signal is generated using the control loop circuitry. At step S40, a further operating parameter signal is generated using replica generator circuitry that operates from the second power supply that is used to power the functional circuitry. At step S50, a comparison is performed between the operating parameter signal and the further operating parameter signal. This causes an adjusted input signal to be produced which is provided to the generator circuitry. Consequently, at step S60, the generator circuitry uses the adjusted input signal to generate the operating parameter signal, which is sent to the functional circuitry.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

We claim:

1. Operating parameter circuitry, comprising:
control loop circuitry operating from a first power supply to provide an operating parameter signal to functional circuitry operating from a second power supply separate from the first power supply, the control loop circuitry comprising generator circuitry to generate the operating parameter signal based on an input signal, the control loop circuitry comprising loop filter circuitry to generate the input signal in dependence on the operating parameter signal generated by the generator circuitry;
replica generator circuitry operating from the second power supply to generate a further operating parameter signal based on the input signal; and
adjustment circuitry to perform a comparison on the operating parameter signal and the further operating parameter signal and to cause an adjusted input signal to be produced in dependence on a result of the comparison, wherein the adjusted input signal is received by the generator circuitry.

2. The operating parameter circuitry according to claim 1, wherein the adjustment circuitry comprises:
comparison circuitry to perform the comparison to generate a comparison signal; and
filter circuitry to generate an adjustment value in dependence on the comparison signal, to apply to the input signal to produce the adjusted input signal.

3. The operating parameter circuitry according to claim 2, wherein the comparison circuitry comprises a phase-frequency detector.

4. The operating parameter circuitry according to claim 2, wherein the comparison circuitry comprises a time to digital converter.

5. The operating parameter circuitry according to claim 2, wherein the filter circuitry comprises:
high-pass filter circuitry to at least reduce differences between the operating parameter signal and the further operating parameter signal that are above an upper frequency limit.

6. The operating parameter circuitry according to claim 5, wherein the upper frequency limit is a value within the range 100-200 MHz.

7. The operating parameter circuitry according to claim 2, wherein the filter circuitry comprises:
low-pass filter circuitry to at least reduce differences between the operating parameter and the further operating parameter that are below a lower frequency limit.

8. The operating parameter circuitry according to claim 7, wherein the lower frequency limit is approximately 1 MHz.

9. The operating parameter circuitry according to claim 1, wherein the operating parameter is a clock signal for the functional circuitry; and the control loop is a phase locked loop.

10. The operating parameter circuitry according to claim 9, wherein the generator circuitry and the replica generator circuitry each comprise oscillator circuitry; and the input signal is generated internally within the phase locked loop.

11. The operating parameter circuitry according to claim 10, wherein the oscillator circuitry in each of the replica generator circuitry and generator circuitry is a digitally controlled oscillator.

12. The operating parameter circuitry according to claim 1, wherein the adjustment circuitry comprises: threshold circuitry to place a limit on the adjustment value, such that the operating parameter signal generated by the generating circuitry meets a threshold requirement.

13. The operating parameter circuitry according to claim 1, comprising:
monitoring circuitry to perform a predefined action in dependence on the result of the comparison.

14. Operating parameter circuitry, comprising:
control loop circuitry operating from a first power supply to provide an operating parameter signal to functional circuitry operating from a second power supply separate from the first power supply, the control loop circuitry comprising generator circuitry to generate the operating parameter signal based on an input signal;
replica generator circuitry operating from the second power supply to generate a further operating parameter signal based on the input signal;
adjustment circuitry to perform a comparison on the operating parameter signal and the further operating parameter signal and to cause an adjusted input signal to be produced in dependence on a result of the comparison, wherein the adjusted input signal is received by the generator circuitry; and
monitoring circuitry to perform a predefined action in dependence on the result of the comparison, wherein the operating parameter signal is a clock signal;
the monitoring circuitry comprises clock gating circuitry; and
the predefined action is to halt the clock signal if the result of the comparison exceeds a predefined emergency limit.

15. A method of generating an operating parameter, the method comprising:
supplying power from a first power supply to control loop circuitry;
supplying power from a second power supply, separate from the first power supply, to functional circuitry;
generating an operating parameter signal based on an input signal using the control loop circuitry;
generating the input signal in dependence on the operating parameter signal using the control loop circuitry;
generating a further operating parameter signal based on the input signal using replica generator circuitry operating from the second power supply;
performing a comparison on the operating parameter signal and the further operating parameter signal to cause an adjusted input signal to be produced in dependence on a result of the comparison; and
providing the operating parameter signal to the functional circuitry,
wherein the adjusted input signal is received by generator circuitry.

16. Operating parameter circuitry, comprising:
control loop circuitry, operating from a first power supply, for providing an operating parameter signal to functional circuitry for performing a function operating from a second power supply separate from the first power supply, the control loop circuitry comprising generator circuitry for generating the operating parameter signal based on an input signal, the control loop circuitry comprising loop filter circuitry for generating the input signal in dependence on the operating parameter signal;
replica generator circuitry, operating from the second power supply, for generating a further operating parameter signal based on the input signal received from the loop filter circuitry; and
adjustment circuitry for performing a comparison on the operating parameter signal and the further operating parameter signal and for causing an adjusted input signal to be produced in dependence on a result of the comparison,
wherein the adjusted input signal is received by the generator circuitry.

* * * * *